(12) United States Patent
Shum et al.

(10) Patent No.: US 9,564,156 B1
(45) Date of Patent: Feb. 7, 2017

(54) HEAD GIMBAL ASSEMBLY HAVING A FLEXURE TAIL WITH COVER LAYER STANDOFF ISLANDS

(71) Applicant: Western Digital Technologies, Inc., Irvine, CA (US)

(72) Inventors: Wing Chun Shum, San Jose, CA (US); Yanning Liu, San Jose, CA (US); John E. Scura, Paso Robles, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 15/007,646

(22) Filed: Jan. 27, 2016

(51) Int. Cl.
*G11B 5/48* (2006.01)

(52) U.S. Cl.
CPC ............. *G11B 5/486* (2013.01); *G11B 5/4853* (2013.01)

(58) Field of Classification Search
CPC ...... G11B 5/486; G11B 5/4853; G11B 5/4846
See application file for complete search history.

(56) References Cited

U.S. PATENT DOCUMENTS

| | | | |
|---|---|---|---|
| 5,235,482 A | 8/1993 | Schmitz | |
| 5,991,123 A | 11/1999 | Casey | |
| 6,046,886 A | 4/2000 | Himes et al. | |
| 6,046,889 A | 4/2000 | Berding et al. | |
| 6,052,890 A | 4/2000 | Malagrino, Jr. et al. | |
| 6,061,206 A | 5/2000 | Foisy et al. | |
| 6,101,876 A | 8/2000 | Brooks et al. | |
| 6,147,831 A | 11/2000 | Kennedy et al. | |
| 6,151,189 A | 11/2000 | Brooks | |
| 6,151,197 A | 11/2000 | Larson et al. | |
| 6,185,067 B1 | 2/2001 | Chamberlain | |
| 6,185,074 B1 | 2/2001 | Wang et al. | |
| 6,208,486 B1 | 3/2001 | Gustafson et al. | |
| 6,215,616 B1 | 4/2001 | Phan et al. | |
| 6,272,694 B1 | 8/2001 | Knoth | |
| 6,288,866 B1 | 9/2001 | Butler et al. | |
| 6,292,333 B1 | 9/2001 | Blumentritt et al. | |
| 6,344,950 B1 | 2/2002 | Watson et al. | |
| 6,349,464 B1 | 2/2002 | Codilian et al. | |
| 6,388,873 B1 | 5/2002 | Brooks et al. | |
| 6,417,979 B1 | 7/2002 | Patton, III et al. | |

(Continued)

FOREIGN PATENT DOCUMENTS

WO 03060887 7/2003

*Primary Examiner* — Will J Klimowicz
(74) *Attorney, Agent, or Firm* — Barcelo, Harrison & Walker LLP; Joshua C. Harrison, Esq.

(57) ABSTRACT

A head gimbal assembly (HGA) for a disk drive includes a load beam, a laminated flexure attached to the load beam, and a head attached to the laminated flexure. The laminated flexure includes a tail for electrical connection between the head and a flex cable of a head stack assembly. The laminated flexure tail may include a plurality of conductive traces, a structural layer, and a dielectric layer there between, and may be disposed partially within a slot of an actuator arm. A first insulative cover layer is disposed on the plurality of conductive traces. A plurality of stand-off islands is disposed on the first insulative cover layer, and over at least one of the plurality of conductive traces (e.g. the writer traces). At least one of the plurality of stand-off islands is at least partially disposed between the first insulative cover layer and the inner slot surface.

24 Claims, 6 Drawing Sheets

(56) References Cited

U.S. PATENT DOCUMENTS

| | | | |
|---|---|---|---|
| 6,421,208 B1 | 7/2002 | Oveyssi | |
| 6,441,998 B1 | 8/2002 | Abrahamson | |
| 6,462,914 B1 | 10/2002 | Oveyssi et al. | |
| 6,466,398 B1 | 10/2002 | Butler et al. | |
| 6,469,871 B1 | 10/2002 | Wang | |
| 6,502,300 B1 | 1/2003 | Casey et al. | |
| 6,519,116 B1 | 2/2003 | Lin et al. | |
| 6,529,345 B1 | 3/2003 | Butler et al. | |
| 6,529,351 B1 | 3/2003 | Oveyssi et al. | |
| 6,535,358 B1 | 3/2003 | Hauert et al. | |
| 6,545,382 B1 | 4/2003 | Bennett | |
| 6,549,381 B1 | 4/2003 | Watson | |
| 6,560,065 B1 | 5/2003 | Yang et al. | |
| 6,571,460 B1 | 6/2003 | Casey et al. | |
| 6,574,073 B1 | 6/2003 | Hauert et al. | |
| 6,580,574 B1 | 6/2003 | Codilian | |
| 6,594,111 B1 | 7/2003 | Oveyssi et al. | |
| 6,603,620 B1 | 8/2003 | Berding | |
| 6,618,222 B1 | 9/2003 | Watkins et al. | |
| 6,624,966 B1 | 9/2003 | Ou-Yang et al. | |
| 6,624,980 B1 | 9/2003 | Watson et al. | |
| 6,624,983 B1 | 9/2003 | Berding | |
| 6,628,473 B1 | 9/2003 | Codilian et al. | |
| 6,654,200 B1 | 11/2003 | Alexander et al. | |
| 6,657,811 B1 | 12/2003 | Codilian | |
| 6,661,597 B1 | 12/2003 | Codilian et al. | |
| 6,661,603 B1 | 12/2003 | Watkins et al. | |
| 6,674,600 B1 | 1/2004 | Codilian et al. | |
| 6,690,637 B1 | 2/2004 | Codilian | |
| 6,693,767 B1 | 2/2004 | Butler | |
| 6,693,773 B1 | 2/2004 | Sassine | |
| 6,697,217 B1 | 2/2004 | Codilian | |
| 6,698,286 B1 | 3/2004 | Little et al. | |
| 6,700,736 B1 | 3/2004 | Wu et al. | |
| 6,704,167 B1 | 3/2004 | Scura et al. | |
| 6,707,637 B1 | 3/2004 | Codilian et al. | |
| 6,707,641 B1 | 3/2004 | Oveyssi et al. | |
| 6,710,980 B1 | 3/2004 | Hauert et al. | |
| 6,710,981 B1 | 3/2004 | Oveyssi et al. | |
| 6,728,062 B1 | 4/2004 | Ou-Yang et al. | |
| 6,728,063 B1 | 4/2004 | Gustafson et al. | |
| 6,731,470 B1 | 5/2004 | Oveyssi | |
| 6,735,033 B1 | 5/2004 | Codilian et al. | |
| 6,741,428 B1 | 5/2004 | Oveyssi | |
| 6,751,051 B1 | 6/2004 | Garbarino | |
| 6,754,042 B1 | 6/2004 | Chiou et al. | |
| 6,757,132 B1 | 6/2004 | Watson et al. | |
| 6,759,784 B1 | 7/2004 | Gustafson et al. | |
| 6,781,780 B1 | 8/2004 | Codilian | |
| 6,781,787 B1 | 8/2004 | Codilian et al. | |
| 6,781,791 B1 | 8/2004 | Griffin et al. | |
| 6,790,066 B1 | 9/2004 | Klein | |
| 6,791,791 B1 | 9/2004 | Alfred et al. | |
| 6,791,801 B1 | 9/2004 | Oveyssi | |
| 6,795,262 B1 | 9/2004 | Codilian et al. | |
| 6,798,603 B1 | 9/2004 | Singh et al. | |
| 6,801,389 B1 | 10/2004 | Berding et al. | |
| 6,801,404 B1 | 10/2004 | Oveyssi | |
| 6,816,342 B1 | 11/2004 | Oveyssi | |
| 6,816,343 B1 | 11/2004 | Oveyssi | |
| 6,825,622 B1 | 11/2004 | Ryan et al. | |
| 6,826,009 B1 | 11/2004 | Scura et al. | |
| 6,831,810 B1 | 12/2004 | Butler et al. | |
| 6,839,199 B1 | 1/2005 | Alexander, Jr. et al. | |
| 6,844,996 B1 | 1/2005 | Berding et al. | |
| 6,847,504 B1 | 1/2005 | Bennett et al. | |
| 6,847,506 B1 | 1/2005 | Lin et al. | |
| 6,856,491 B1 | 2/2005 | Oveyssi | |
| 6,856,492 B2 | 2/2005 | Oveyssi | |
| 6,862,154 B1 | 3/2005 | Subrahmanyam et al. | |
| 6,862,156 B1 | 3/2005 | Lin et al. | |
| 6,862,176 B1 | 3/2005 | Codilian et al. | |
| 6,865,049 B1 | 3/2005 | Codilian et al. | |
| 6,865,055 B1 | 3/2005 | Ou-Yang et al. | |
| 6,867,946 B1 | 3/2005 | Berding et al. | |
| 6,867,950 B1 | 3/2005 | Lin | |
| 6,876,514 B1 | 4/2005 | Little | |
| 6,879,466 B1 | 4/2005 | Oveyssi et al. | |
| 6,888,697 B1 | 5/2005 | Oveyssi | |
| 6,888,698 B1 | 5/2005 | Berding et al. | |
| 6,891,696 B1 | 5/2005 | Ou-Yang et al. | |
| 6,898,052 B1 | 5/2005 | Oveyssi | |
| 6,899,549 B2 * | 5/2005 | DeFord | H01R 13/2435 439/71 |
| 6,900,961 B1 | 5/2005 | Butler | |
| 6,900,967 B1 | 5/2005 | Coon et al. | |
| 6,906,880 B1 | 6/2005 | Codilian | |
| 6,906,897 B1 | 6/2005 | Oveyssi | |
| 6,908,330 B2 | 6/2005 | Garrett et al. | |
| 6,922,308 B1 | 7/2005 | Butler | |
| 6,930,848 B1 | 8/2005 | Codilian et al. | |
| 6,930,857 B1 | 8/2005 | Lin et al. | |
| 6,934,126 B1 | 8/2005 | Berding et al. | |
| 6,937,444 B1 | 8/2005 | Oveyssi | |
| 6,940,698 B2 | 9/2005 | Lin et al. | |
| 6,941,642 B1 | 9/2005 | Subrahmanyam et al. | |
| 6,947,251 B1 | 9/2005 | Oveyssi et al. | |
| 6,950,275 B1 | 9/2005 | Ali et al. | |
| 6,950,284 B1 | 9/2005 | Lin | |
| 6,952,318 B1 | 10/2005 | Ngo | |
| 6,954,329 B1 | 10/2005 | Ojeda et al. | |
| 6,958,884 B1 | 10/2005 | Ojeda et al. | |
| 6,958,890 B1 | 10/2005 | Lin et al. | |
| 6,961,212 B1 | 11/2005 | Gustafson et al. | |
| 6,961,218 B1 | 11/2005 | Lin et al. | |
| 6,963,469 B1 | 11/2005 | Gustafson et al. | |
| 6,965,500 B1 | 11/2005 | Hanna et al. | |
| 6,967,800 B1 | 11/2005 | Chen et al. | |
| 6,967,804 B1 | 11/2005 | Codilian | |
| 6,970,329 B1 | 11/2005 | Oveyssi et al. | |
| 6,972,924 B1 | 12/2005 | Chen et al. | |
| 6,972,926 B1 | 12/2005 | Codilian | |
| 6,975,476 B1 | 12/2005 | Berding | |
| 6,975,488 B1 | 12/2005 | Kulangara et al. | |
| 6,979,931 B1 | 12/2005 | Gustafson et al. | |
| 6,980,391 B1 | 12/2005 | Haro | |
| 6,980,401 B1 | 12/2005 | Narayanan et al. | |
| 6,982,853 B1 | 1/2006 | Oveyssi et al. | |
| 6,989,953 B1 | 1/2006 | Codilian | |
| 6,990,727 B1 | 1/2006 | Butler et al. | |
| 6,996,893 B1 | 2/2006 | Ostrander et al. | |
| 7,000,309 B1 | 2/2006 | Klassen et al. | |
| 7,006,324 B1 | 2/2006 | Oveyssi et al. | |
| 7,013,731 B1 | 3/2006 | Szeremeta et al. | |
| 7,031,104 B1 | 4/2006 | Butt et al. | |
| 7,035,053 B1 | 4/2006 | Oveyssi et al. | |
| 7,050,270 B1 | 5/2006 | Oveyssi et al. | |
| 7,057,852 B1 | 6/2006 | Butler et al. | |
| 7,062,837 B1 | 6/2006 | Butler | |
| 7,064,921 B1 | 6/2006 | Yang et al. | |
| 7,064,922 B1 | 6/2006 | Alfred et al. | |
| 7,064,932 B1 | 6/2006 | Lin et al. | |
| 7,085,098 B1 | 8/2006 | Yang et al. | |
| 7,085,108 B1 | 8/2006 | Oveyssi et al. | |
| 7,092,216 B1 | 8/2006 | Chang et al. | |
| 7,092,251 B1 | 8/2006 | Henry | |
| 7,099,099 B1 | 8/2006 | Codilian et al. | |
| 7,099,117 B1 | 8/2006 | Subrahmanyam et al. | |
| 7,113,371 B1 | 9/2006 | Hanna et al. | |
| 7,142,397 B1 | 11/2006 | Venk | |
| 7,145,753 B1 | 12/2006 | Chang et al. | |
| RE39,478 E | 1/2007 | Hatch et al. | |
| 7,161,768 B1 | 1/2007 | Oveyssi | |
| 7,161,769 B1 | 1/2007 | Chang et al. | |
| 7,180,711 B1 | 2/2007 | Chang et al. | |
| 7,193,819 B1 | 3/2007 | Chen et al. | |
| 7,209,317 B1 | 4/2007 | Berding et al. | |
| 7,209,319 B1 | 4/2007 | Watkins et al. | |
| D542,289 S | 5/2007 | Diebel | |
| 7,212,377 B1 | 5/2007 | Ou-Yang et al. | |
| 7,215,513 B1 | 5/2007 | Chang et al. | |
| 7,215,514 B1 | 5/2007 | Yang et al. | |
| 7,224,551 B1 | 5/2007 | Ou-Yang et al. | |
| D543,981 S | 6/2007 | Diebel | |

(56) References Cited

U.S. PATENT DOCUMENTS

| | | |
|---|---|---|
| 7,227,725 B1 | 6/2007 | Chang et al. |
| 7,239,475 B1 | 7/2007 | Lin et al. |
| 7,271,978 B1 | 9/2007 | Santini et al. |
| 7,274,534 B1 | 9/2007 | Choy et al. |
| 7,280,311 B1 | 10/2007 | Ou-Yang et al. |
| 7,280,317 B1 | 10/2007 | Little et al. |
| 7,280,319 B1 | 10/2007 | McNab |
| 7,292,406 B1 | 11/2007 | Huang |
| 7,298,584 B1 | 11/2007 | Yamada et al. |
| 7,327,537 B1 | 2/2008 | Oveyssi |
| 7,339,268 B1 | 3/2008 | Ho et al. |
| 7,342,746 B1 | 3/2008 | Lin |
| RE40,203 E | 4/2008 | Hatch et al. |
| 7,353,524 B1 | 4/2008 | Lin et al. |
| 7,369,368 B1 | 5/2008 | Mohajerani |
| 7,372,670 B1 | 5/2008 | Oveyssi |
| 7,375,929 B1 | 5/2008 | Chang et al. |
| 7,379,266 B1 | 5/2008 | Ou-Yang et al. |
| 7,381,904 B1 | 6/2008 | Codilian |
| 7,385,784 B1 | 6/2008 | Berding et al. |
| 7,388,731 B1 | 6/2008 | Little et al. |
| 7,420,771 B1 | 9/2008 | Hanke et al. |
| 7,434,987 B1 | 10/2008 | Gustafson et al. |
| 7,436,625 B1 | 10/2008 | Chiou et al. |
| 7,440,234 B1 | 10/2008 | Cheng et al. |
| 7,477,488 B1 | 1/2009 | Zhang et al. |
| 7,477,489 B1 | 1/2009 | Chen et al. |
| 7,484,291 B1 | 2/2009 | Ostrander et al. |
| 7,505,231 B1 | 3/2009 | Golgolab et al. |
| 7,529,064 B1 | 5/2009 | Huang et al. |
| 7,538,981 B1 | 5/2009 | Pan |
| 7,561,374 B1 | 7/2009 | Codilian et al. |
| 7,567,410 B1 | 7/2009 | Zhang et al. |
| 7,576,955 B1 | 8/2009 | Yang et al. |
| 7,593,181 B1 | 9/2009 | Tsay et al. |
| 7,605,999 B1 | 10/2009 | Kung et al. |
| 7,609,486 B1 | 10/2009 | Little |
| 7,610,672 B1 | 11/2009 | Liebman |
| 7,633,721 B1 | 12/2009 | Little et al. |
| 7,633,722 B1 | 12/2009 | Larson et al. |
| 7,656,609 B1 | 2/2010 | Berding et al. |
| 7,660,075 B1 | 2/2010 | Lin et al. |
| 7,672,083 B1 | 3/2010 | Yu et al. |
| 7,684,155 B1 | 3/2010 | Huang et al. |
| 7,686,555 B1 | 3/2010 | Larson et al. |
| 7,709,078 B1 | 5/2010 | Sevier et al. |
| 7,715,149 B1 | 5/2010 | Liebman et al. |
| 7,729,091 B1 | 6/2010 | Huang et al. |
| 7,751,145 B1 | 7/2010 | Lin et al. |
| 7,826,177 B1 | 11/2010 | Zhang et al. |
| 7,852,601 B1 | 12/2010 | Little |
| 7,864,488 B1 | 1/2011 | Pan |
| 7,898,770 B1 | 3/2011 | Zhang et al. |
| 7,903,369 B1 | 3/2011 | Codilian et al. |
| 7,907,369 B1 | 3/2011 | Pan |
| 7,911,742 B1 | 3/2011 | Chang et al. |
| 7,926,167 B1 | 4/2011 | Liebman et al. |
| 7,957,095 B1 | 6/2011 | Tsay et al. |
| 7,957,102 B1 | 6/2011 | Watson et al. |
| 7,961,436 B1 | 6/2011 | Huang et al. |
| 8,004,782 B1 | 8/2011 | Nojaba et al. |
| 8,009,384 B1 | 8/2011 | Little |
| 8,018,687 B1 | 9/2011 | Little et al. |
| 8,031,431 B1 | 10/2011 | Berding et al. |
| 8,064,168 B1 * | 11/2011 | Zhang ............... G11B 5/4833 360/245.4 |
| 8,064,170 B1 | 11/2011 | Pan |
| 8,068,314 B1 | 11/2011 | Pan et al. |
| 8,081,401 B1 | 12/2011 | Huang et al. |
| 8,100,017 B1 | 1/2012 | Blick et al. |
| 8,116,038 B1 | 2/2012 | Zhang et al. |
| 8,125,740 B1 | 2/2012 | Yang et al. |
| 8,142,671 B1 | 3/2012 | Pan |
| 8,156,633 B1 | 4/2012 | Foisy |
| 8,159,785 B1 | 4/2012 | Lee et al. |
| 8,189,298 B1 | 5/2012 | Lee et al. |
| 8,194,348 B2 | 6/2012 | Jacoby et al. |
| 8,194,354 B1 | 6/2012 | Zhang et al. |
| 8,194,355 B1 | 6/2012 | Pan et al. |
| 8,203,806 B2 | 6/2012 | Larson et al. |
| 8,223,453 B1 | 7/2012 | Norton et al. |
| 8,228,631 B1 | 7/2012 | Tsay et al. |
| 8,233,239 B1 | 7/2012 | Teo et al. |
| 8,248,733 B1 | 8/2012 | Radavicius et al. |
| 8,259,417 B1 | 9/2012 | Ho et al. |
| 8,274,760 B1 | 9/2012 | Zhang et al. |
| 8,276,256 B1 | 10/2012 | Zhang et al. |
| 8,279,560 B1 | 10/2012 | Pan |
| 8,284,514 B1 | 10/2012 | Garbarino |
| 8,289,646 B1 | 10/2012 | Heo et al. |
| 8,300,352 B1 | 10/2012 | Larson et al. |
| 8,305,708 B2 | 11/2012 | Tacklind |
| 8,320,086 B1 | 11/2012 | Moradnouri et al. |
| 8,322,021 B1 | 12/2012 | Berding et al. |
| 8,345,387 B1 | 1/2013 | Nguyen |
| 8,363,351 B1 | 1/2013 | Little |
| 8,369,044 B2 | 2/2013 | Howie et al. |
| 8,411,389 B1 | 4/2013 | Tian et al. |
| 8,416,522 B1 | 4/2013 | Schott et al. |
| 8,416,534 B1 | 4/2013 | Heo et al. |
| 8,422,171 B1 | 4/2013 | Guerini |
| 8,422,175 B1 | 4/2013 | Oveyssi |
| 8,432,641 B1 | 4/2013 | Nguyen |
| 8,437,101 B1 | 5/2013 | German et al. |
| 8,438,721 B1 | 5/2013 | Sill |
| 8,446,688 B1 | 5/2013 | Quines et al. |
| 8,451,559 B1 | 5/2013 | Berding et al. |
| 8,467,153 B1 | 6/2013 | Pan et al. |
| 8,472,131 B1 | 6/2013 | Ou-Yang et al. |
| 8,477,460 B1 | 7/2013 | Liebman |
| 8,488,270 B2 | 7/2013 | Brause et al. |
| 8,488,280 B1 | 7/2013 | Myers et al. |
| 8,499,652 B1 | 8/2013 | Tran et al. |
| 8,503,133 B2 * | 8/2013 | Arai ............... G11B 5/4833 360/244.1 |
| 8,514,514 B1 | 8/2013 | Berding et al. |
| 8,530,032 B1 | 9/2013 | Sevier et al. |
| 8,542,465 B2 | 9/2013 | Liu et al. |
| 8,547,664 B1 | 10/2013 | Foisy et al. |
| 8,553,356 B1 | 10/2013 | Heo et al. |
| 8,553,366 B1 | 10/2013 | Hanke |
| 8,553,367 B1 | 10/2013 | Foisy et al. |
| 8,605,389 B1 | 12/2013 | Pan et al. |
| 8,616,900 B1 | 12/2013 | Lion |
| 8,665,555 B1 | 3/2014 | Young et al. |
| 8,667,667 B1 | 3/2014 | Nguyen et al. |
| 8,693,139 B2 | 4/2014 | Tian et al. |
| 8,693,140 B1 | 4/2014 | Weiher et al. |
| 8,699,179 B1 | 4/2014 | Golgolab et al. |
| 8,702,998 B1 | 4/2014 | Guerini |
| 8,705,201 B2 | 4/2014 | Casey et al. |
| 8,705,209 B2 | 4/2014 | Seymour et al. |
| 8,717,706 B1 | 5/2014 | German et al. |
| 8,743,509 B1 | 6/2014 | Heo et al. |
| 8,755,148 B1 | 6/2014 | Howie et al. |
| 8,756,776 B1 | 6/2014 | Chen et al. |
| 8,760,800 B1 | 6/2014 | Brown et al. |
| 8,760,814 B1 | 6/2014 | Pan et al. |
| 8,760,816 B1 | 6/2014 | Myers et al. |
| 8,773,812 B1 | 7/2014 | Gustafson et al. |
| 8,780,491 B1 | 7/2014 | Perlas et al. |
| 8,780,504 B1 | 7/2014 | Teo et al. |
| 8,792,205 B1 | 7/2014 | Boye-Doe et al. |
| 8,797,677 B2 | 8/2014 | Heo et al. |
| 8,797,689 B1 | 8/2014 | Pan et al. |
| 8,824,095 B1 | 9/2014 | Dougherty |
| 8,824,098 B1 | 9/2014 | Huang et al. |
| 8,934,199 B1 * | 1/2015 | Pan ............... G11B 5/4853 360/245.4 |
| 2003/0123194 A1 * | 7/2003 | Korkowski ............... G11B 5/486 360/245.9 |
| 2011/0212281 A1 | 9/2011 | Jacoby et al. |
| 2013/0038964 A1 | 2/2013 | Garbarino et al. |

(56) References Cited

U.S. PATENT DOCUMENTS

2013/0091698 A1    4/2013   Banshak, Jr. et al.
2013/0155546 A1    6/2013   Heo et al.
2013/0290988 A1   10/2013   Watson et al.

\* cited by examiner

HEAD GIMBAL ASSEMBLY HAVING A FLEXURE TAIL WITH COVER LAYER STANDOFF ISLANDS

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write. All heads that can read or write may be referred to as read/write heads herein, regardless of whether the head is also capable of other functions and/or includes other structures, such as a heater, laser, microactutor, lapping guide, etc.

In a modern magnetic hard disk drive device, each read/write head is a sub-component of a head-gimbal assembly (HGA) that typically includes a laminated flexure to carry the electrical signals to and from the read/write head. The HGA, in turn, is a sub-component of a head-stack assembly (HSA) that typically includes a plurality of HGAs, an actuator, and a flexible printed circuit (FPC). The plurality of HGAs are attached to various arms of the actuator.

Modern laminated flexures typically include flexure conductive traces that are isolated from a flexure structural layer by a flexure dielectric layer. So that the signals from or to the read/write head can reach the FPC on the actuator body, each HGA flexure includes a flexure tail that extends away from the head along a corresponding actuator arm and ultimately attaches to the FPC adjacent the actuator body. That is, the flexure includes flexure traces that extend from adjacent the read/write head and continue along the flexure tail to a flexure tail terminal region that includes electrically conductive flexure bond pads adjacent the FPC.

Each flexure tail is physically held adjacent a supporting actuator arm, typically by adhesive tacking within a groove along a side of the actuator arm. If the flexure tail is not adequately secured to the actuator arm, air induced by disk rotation can cause the flexure tail to excessively flutter. An insulative cover layer typically covers the conductive traces along the flexure tail, for example to prevent incidental shorting by contact with any adjacent conductive body, or with tooling during assembly.

Greater signal bandwidth in the flexure tail transmission path may allow improvement of recording and readback rates, which may enable improved information storage device performance and capacity. Accordingly, there is a need in the art for an improved HGA design that may improve the transmission bandwidth for signals sent to or from the read/write head.

DESCRIPTION OF THE PREFERRED EMBODIMENTS

Figure 1:
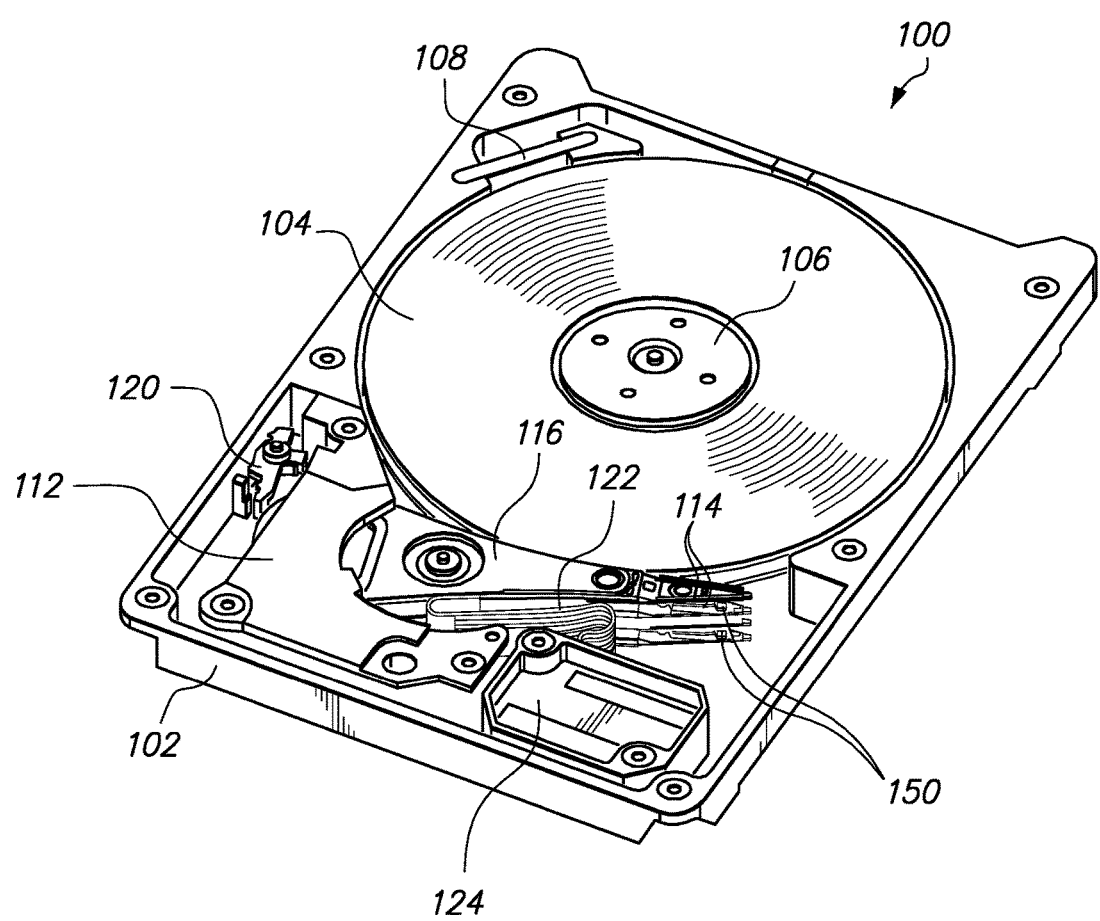
FIG. 1 is top perspective view of a disk drive capable of including an embodiment of the present invention, with the top cover removed to reveal internal components.

FIG. 1 is a top perspective view of a disk drive 100 capable of including an embodiment of the present invention. The disk drive 100 includes a disk drive base 102 and two annular magnetic disks 104. The disk drive 100 further includes a spindle 106, rotatably mounted on the disk drive base 102, for rotating the disks 104. The rotation of the disks 104 establishes air flow through recirculation filter 108. In other embodiments, disk drive 100 may have only a single disk, or alternatively, more than two disks.

The disk drive 100 further includes a head stack assembly (HSA) 116 that is pivotably mounted on disk drive base 102. Voice coil motor 112 rotates the HSA 116 through a limited angular range so that at least one head gimbal assembly (HGA) 114 is desirably positioned relative to one or more tracks of information on a corresponding one of the disks 104. In the embodiment of FIG. 1, the HSA 116 includes three actuator arms upon which four HGAs 114 are attached, each corresponding to a surface of one of the two disks 104. However in other embodiments fewer or more HGAs 114 may be included depending on the number of disks 104 that are included and whether the disk drive 100 is depopulated. Each HGA 114 includes a head 150 for reading and writing data from and to one of the disks 104. The HSA 116 may occasionally be latched at an extreme angular position within the limited angular range, by latch 120. Electrical signals to/from the HGAs 114 are carried to other drive electronics via a flexible printed circuit (FPC) that includes a flex cable 122 (preferably including a preamplifier circuit) and flex cable bracket 124, the FPC being part of the HSA 116.

Figure 2:
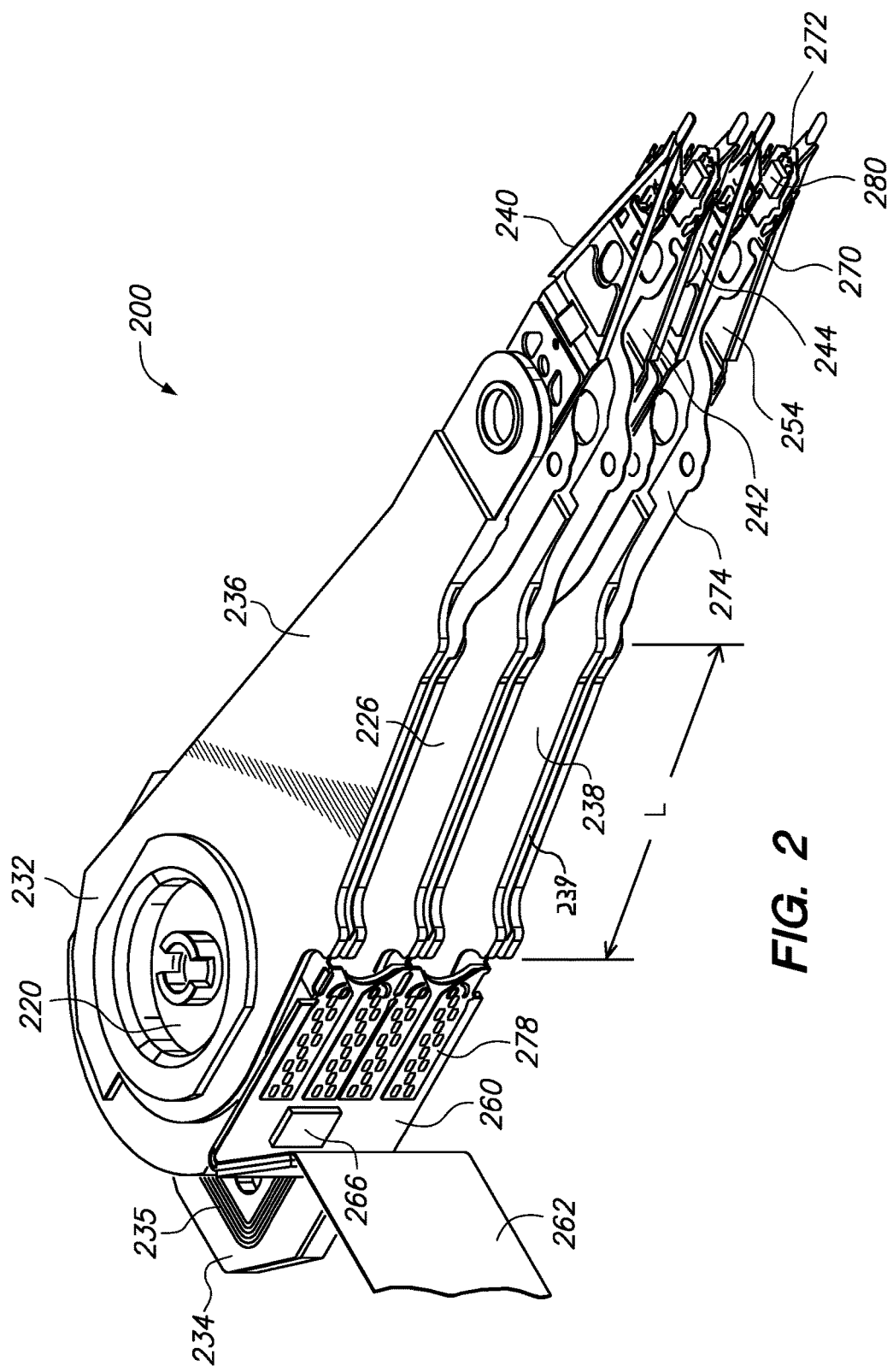
FIG. 2 is a perspective view of a head stack assembly (HSA) capable of including an embodiment of the present invention.

FIG. 2 is a perspective view of a head stack assembly (HSA) 200 capable of including an embodiment of the present invention. The HSA 200 includes an actuator body 232 and a plurality of actuator arms 226, 236, 238 extending from the actuator body 232. The actuator body 232 includes a pivot bearing cartridge 220 disposed in the actuator bore, and a coil support 234 that supports a coil 235 and extends from the actuator body 232 in a direction that is generally opposite the actuator arms 226, 236, 238. The HSA 200 also includes a plurality of head gimbal assemblies (HGA) 240, 242, 244, 254, attached to the actuator arms 226, 236, 238. For example, such attachment may be made by swaging. Note that the inner actuator arm 226 includes two HGAs, while each of the outer actuator arms 236, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a dummy mass.

In the embodiment of FIG. 2, the HSA 200 includes a flexible printed circuit (FPC) 260 adjacent the actuator body 232. The FPC 260 includes a flex cable 262 and a preamplifier 266. The FPC 260 may comprise a laminate that includes two or more conventional dielectric and conductive layer materials (e.g. one or more polymeric materials, copper, etc.).

In the embodiment of FIG. 2, each HGA 240, 242, 244, 254, includes a head for reading and/or writing to an adjacent disk surface (e.g. HGA 254 includes head 280). The head 280 is attached to a tongue portion 272 of a laminated flexure 270. The laminated flexure 270 is part of the HGA 254, and is attached to a load beam (the part of the HGA 254 to which the numerical label 254 points). The laminated flexure 270 may include a structural layer (e.g. stainless steel), a dielectric layer (e.g. polyimide), and a conductive layer into which traces are patterned (e.g. copper), and an insulative cover layer deposited over the traces.

In the embodiment of FIG. 2, the laminated flexure 270 includes a flexure tail 274 that runs along the actuator arm 238 to a terminal region 278 of the laminated flexure 270 that is electrically connected to FPC bond pads of the FPC 260. A side of the actuator arm 238 may include a slot 239, and the laminated flexure tail 274 may be disposed at least partially within the slot 239, for example to better secure the laminated flexure tail 274 from exhibiting excessive flutter due to the air flow induced by disk rotation during disk drive operation. For example, in certain embodiments, the laminated flexure tail 274 may be disposed partially or wholly within the slot 239, over a slot length L that is substantially less than a total length of the laminated flexure tail 274.

Methods of electrical connection of the flexure tails to the FPC 260 include ultrasonic bonding of gold coatings thereon, solder reflow, solder ball jet (SBJ), and anisotropic conductive film (ACF) bonding, and are preferably but not necessarily automated. To electrically connect and securely attach the flexure tails to the FPC 260, the flexure tails are first aligned with the FPC 260, and then pressed against the FPC 260 (at least temporarily) while electrical connection is established and secure attachment is completed.

Figure 3:
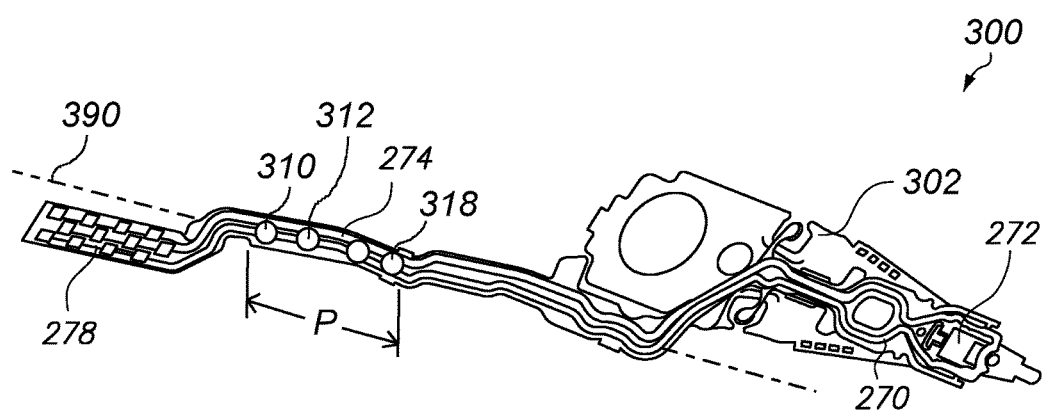
FIG. 3 is a perspective view of a head suspension assembly according to an embodiment of the present invention.

FIG. 3 is a perspective view of a head suspension assembly 300 capable of use with an embodiment of the present invention. Now referring to FIGS. 1, 2, and 3, the suspension assembly 300 may be used in the HGA 254 to support the head 280 after it is assembled into the HGA 254. However, before assembly into the HGA 254, the suspension assembly 300 does not include a head, and suspension assemblies may be manufactured and sold without including a head. The suspension assembly 300 includes a load beam 302. A purpose of the load beam 302, once the suspension assembly 300 is included in the HGA 254, is to provide vertical compliance for the head 280 to follow vertical undulations of the surface of a disk (e.g. disk 104 of FIG. 1) as it rotates, and to preload the head 280 against the surface of the disk 104 as it rotates, by a preload force that is commonly referred to as the "gram load."

In the embodiment of FIG. 3, the suspension assembly 300 also includes a laminated flexure 270 attached to the load beam 302. For example, a structural layer (e.g. stainless steel layer) of the laminated flexure 270 may be spot welded to the load beam 302. Still referring to FIGS. 1, 2, and 3, when the suspension assembly 300 is included in a HGA (e.g. HGA 254), the head 280 is attached to a head mounting surface of a tongue 272 of the laminated flexure 270. A first purpose of the laminated flexure 270 is to provide compliance for the head 280 to follow pitch and roll angular undulations of the surface of disk 104 as it rotates, while restricting motion of the head 280 in the lateral direction and about a yaw axis. A second purpose of the laminated flexure 270 is to provide a plurality of electrical paths to the head 280 to facilitate signal transmission to/from the head 280.

For that second purpose, the laminated flexure 270 may include a plurality of electrically conductive traces that are defined by patterning in a conductive (e.g. copper) layer of the laminated flexure 270. Specifically, the laminated flexure 270 may include a flexure structural layer (e.g. stainless steel), a flexure dielectric layer (e.g. polyimide), and a flexure conductive layer (e.g. copper) in which the flexure conductive traces are defined. A first insulative cover layer may be disposed on the flexure conductive traces, for example to prevent electrical current surges or short circuiting due to contact with adjacent tools or components, for example during head stack assembly.

Still referring to FIGS. 1, 2, and 3, so that the signals from/to the head 280 can reach the FPC 260, the laminated flexure 270 may include a flexure tail 274 that extends away from the head mounting tongue 272 and along the actuator arm 238 of the HSA 200. The laminated flexure tail 274 of FIG. 3 may have a long axis 390 that is oriented approximately parallel to the side of the actuator arm 238. To better secure the laminated flexure tail 274 to the actuator arm 238, the laminated flexure tail 274 may be partially disposed within the slot 239 of the actuator arm 238, over a length P of the laminated flexure tail 274 (which length P, in certain embodiments, may be approximately equal to the slot length L).

Still referring to FIGS. 1, 2, and 3, in certain embodiments the laminated flexure tail 274 may include a plurality of stand-off islands 310, 312, 318 disposed on the first insulative cover layer, and over at least one of the plurality of conductive traces of the laminated flexure tail 274 over the length P. The structure and function of these stand-off islands (e.g. 310, 312, 318) will be described in greater detail subsequently herein. In certain embodiments, the slot 239 may extend longitudinally between a proximal longitudinal extent and a distal longitudinal extent (shown in FIG. 2 as the limiting ends of distance L). Preferably but not necessarily, the stand-off island 310 overlaps the proximal longitudinal extent (left limit of distance L), and stand-off island 318 overlaps the distal longitudinal extent (right limit of distance L).

After passing through the slot 239, the laminated flexure tail 274 ultimately extends to a terminal region 278 where the plurality of conductive traces terminate at flexure bond pads (that are to be electrically connected with corresponding FPC bond pads of the FPC 260 adjacent the actuator body 232). As seen from FIGS. 1, 2, and 3, the flexure tail 274 is a distinct and smaller component, as compared with the FPC 260 or its flex cable 262. Methods of electrical connection of the flexure tail terminal region 278 to the FPC 260 include ultrasonic tab bonding, solder reflow, anisotropic conductive film (ACF) bonding, or solder jet bond (SJB).

Figure 4:
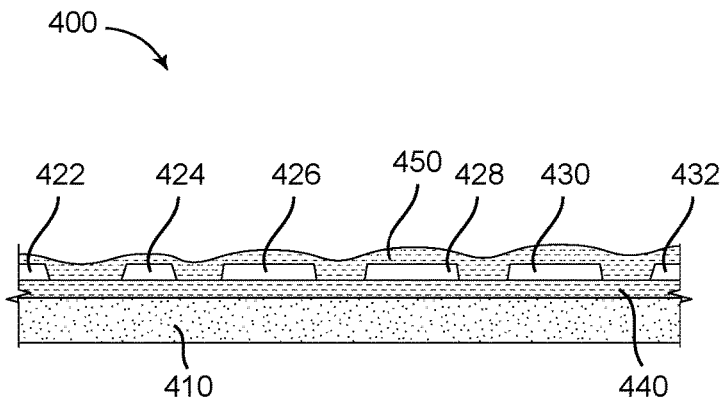
FIG. 4 is a cross-sectional view of a cut-away portion of a flexure tail, according to the prior art.

FIG. 4 is a cross-sectional view of a cut-away portion of a flexure tail 400, according to the prior art. The laminated flexure tail 400 comprises a structural layer 410 and a plurality of conductive traces 422, 424, 426, 428, 430, 432. A dielectric layer 440 is disposed between the structural layer 410 and the plurality of conductive traces 422, 424, 426, 428, 430, 432. An insulative cover layer 450 is disposed on the plurality of conductive traces 422, 424, 426, 428, 430, 432, so that the conductive traces 422, 424, 426, 428, 430, 432 are disposed between the dielectric layer 440 and the insulative cover layer 450. The insulative cover layer 450 may have a spatially varying thickness that reaches a maximum between the conductive traces (rather than over the conductive traces). Deposition of the insulative cover layer 450 may be limited so that such maximum thickness is typically no greater than 18 microns, to avoid excessive stiffness or curl of the laminated flexure tail 400, or to limit deposition process duration or mitigate other process or design related issues.

Figure 5:
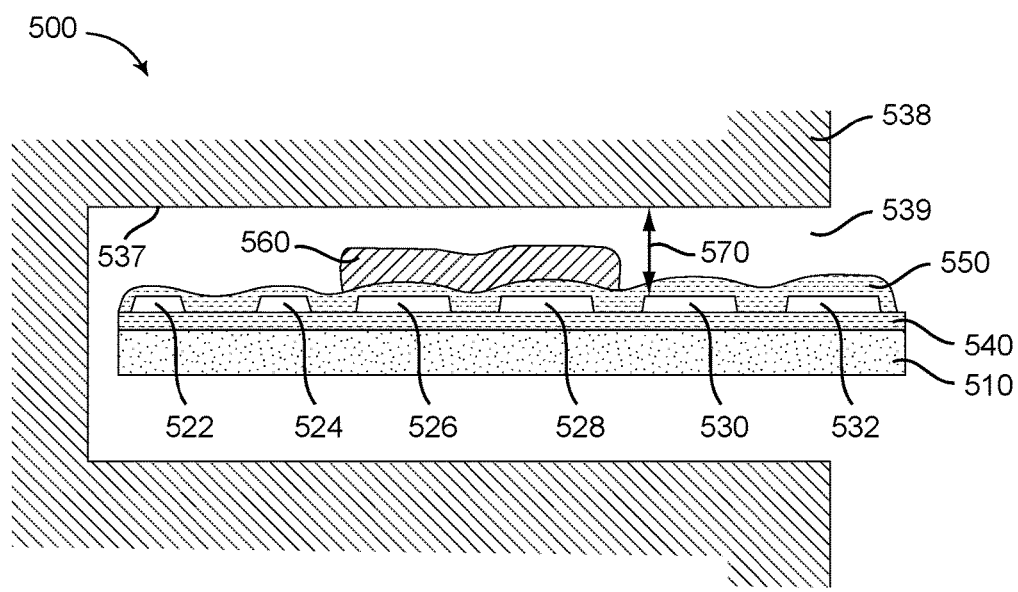
FIG. 5 is a plan view of a cut-away portion of a flexure tail, according to an embodiment of the present invention.

FIG. 5 is a cross-sectional view of a flexure tail 500, disposed at least partially within an actuator arm slot 539, according to an embodiment of the present invention. The laminated flexure tail 500 comprises a structural layer 510 (e.g. stainless steel) and a plurality of conductive traces 522, 524, 526, 528, 530, 532 (e.g. copper or an alloy thereof). In alternative embodiments, the plurality of conductive traces could have more or fewer than six conductive traces, for example depending upon how many different signals must be communicated from/to the read/write head. A dielectric layer 540 (e.g. polyimide) may be disposed between the structural layer 510 and the plurality of conductive traces 522, 524, 526, 528, 530, 532.

In the embodiment of FIG. 5, a first insulative cover layer 550 is disposed on the plurality of conductive traces 522, 524, 526, 528, 530, 532, so that the conductive traces 522, 524, 526, 528, 530, 532 are disposed between the dielectric layer 540 and the first insulative cover layer 550. For example, the first insulative cover layer 540 may comprise polyimide having a thickness of 4 microns to 18 microns.

Figure 6:
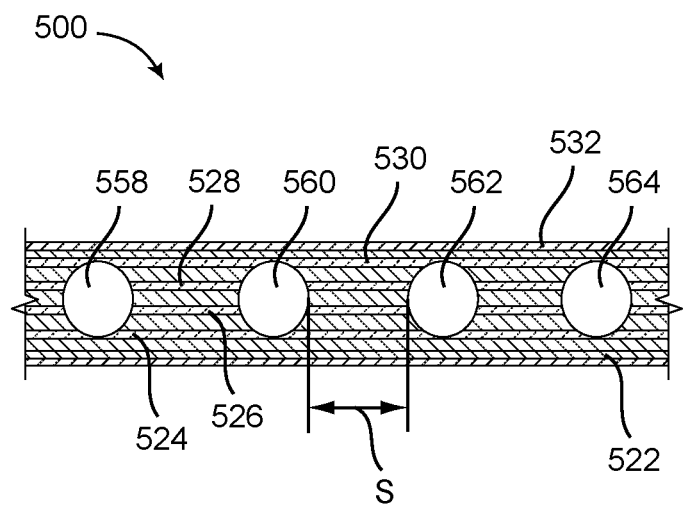
FIG. 6 is a cross-sectional view of a cut-away portion of a flexure tail, according to an embodiment of the present invention.

FIG. 6 is a plan view of a cut-away portion of the flexure tail 500, according to an embodiment of the present invention. Now referring to FIGS. 5 and 6, four stand-off islands 558, 560, 562, 564 may be disposed on the first insulative cover layer 550, and over at least one of the plurality of conductive traces 522, 524, 526, 528, 530, 532 (e.g. over conductive traces 526 and 528). Note that in the cross-sectional view of FIG. 5, the stand-off island 560 is depicted as disposed between the first insulative cover layer 550 and an inner slot surface 537 of the slot 539 of an actuator arm 538 (e.g. an aluminum actuator arm). In certain embodiments, each of the plurality of stand-off islands 558, 560, 562, 564 may be a patterned region of a second insulative cover layer disposed on the first insulative cover layer 550. For example, such a second insulative cover layer may comprise polyimide having a second cover layer thickness in the range 12 microns to 18 microns.

Still referring to FIG. 6, in certain embodiments each of the plurality of the stand-off islands 558, 560, 562, 564 preferably may be longitudinally separated from another by a longitudinal spacing S in the range of 1 mm to 15 mm, and more preferably in the range of 4 mm to 9 mm. In certain embodiments, such dimensional limitations may beneficially limit curl of the conductive traces towards the inner slot surface 537 of the slot 539 of the actuator arm 538. Unlike the plurality of the stand-off islands 558, 560, 562, 564, the first insulative cover layer 550 preferably contiguously covers the conductive traces 522, 524, 526, 528, 530, 532 over the entire continuous length of the portion of the flexure tail 500 that is shown in FIG. 6.

The inventors herein have learned by simulation and experiment that the electrical separation 570 (measured normal to the laminated flexure tail layers) between a conductive trace that is electrically connected to a write transducer of the head (e.g. in certain embodiments, conductive trace 526 or 528), and the inner surface 537 of the actuator arm slot 539 (which may act like a ground plane), may affect the writer bandwidth. Accordingly, certain embodiments of the present invention may preserve writer bandwidth by ensuring a greater minimum separation 570, for example through the presence and the foregoing thickness range of the stand-off islands 558, 560, 562, 564.

Figure 7:
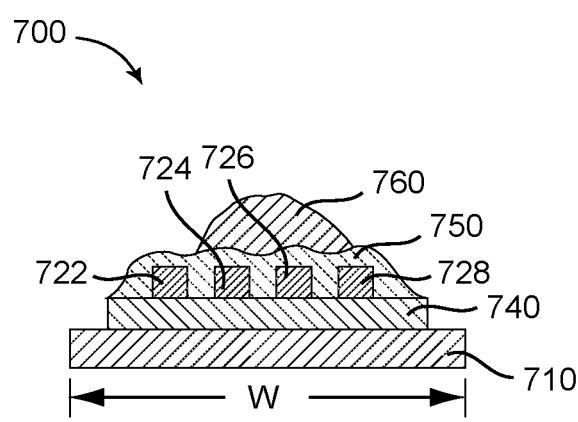
FIG. 7 is a cross-sectional view of a flexure tail according to another embodiment of the present invention.

FIG. 7 is a cross-sectional view of a laminated flexure tail 700 according to another embodiment of the present invention. In the embodiment of FIG. 7, the laminated flexure tail 700 may comprise a structural layer 710 (e.g. stainless steel) and a plurality of conductive traces 722, 724, 726, 728 (e.g. copper or an alloy thereof). For example, the conductive traces 724 and 726 may be connected to a write transducer of a read/write head. In alternative embodiments, the plurality of conductive traces could have more or fewer than four conductive traces, for example depending upon how many different signals must be communicated from/to the read/write head. A dielectric layer 740 (e.g. polyimide) may be disposed between the structural layer 710 and the plurality of conductive traces 722, 724, 726, 728.

In the embodiment of FIG. 7, a first insulative cover layer 750 may be disposed on the plurality of conductive traces 722, 724, 726, 728, so that the plurality of conductive traces is disposed between the dielectric layer 740 and the first insulative cover layer 750. One of a plurality of stand-off islands, stand-off island 760, is disposed on the first insulative cover layer 750 and over the conductive trace 726, so that the first insulative cover layer 750 is disposed between the conductive trace 726 and the stand-off island 760.

In the embodiment of FIG. 7, the stand-off island 760 may comprise an epoxy glob preferably having a maximum thickness that is greater than 18 microns. In certain embodiments, the laminated flexure tail 700 defines a tail width W measured transverse to the long axis (e.g. long axis 390 of FIG. 3). Now referring additionally to FIG. 6, in an alternative embodiment the plurality of stand-off islands 558, 560, 562, 564 may comprise epoxy globs like the stand-off island 760 of FIG. 7. Still referring to FIGS. 6 and 7, in an alternative embodiment the longitudinal spacing S may be at least 4 mm but no more than 4 times the tail width W, regardless of the number of conductive traces in the plurality of conductive traces.

Figure 8:
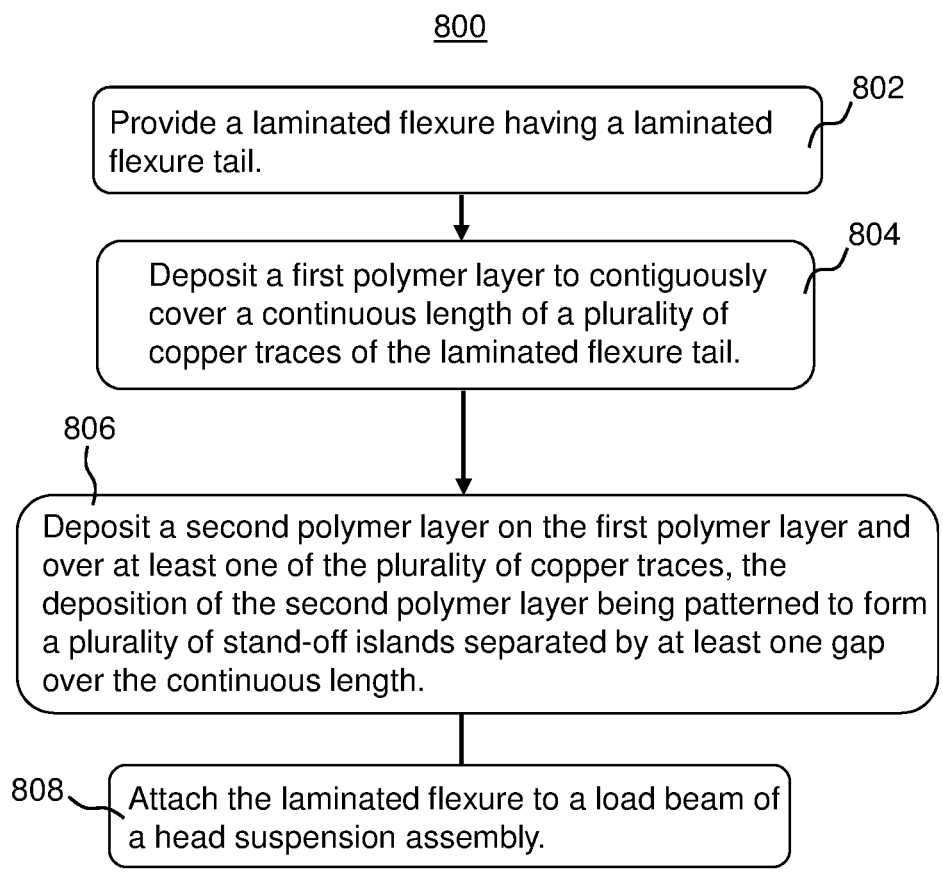
FIG. 8 depicts a method for fabricating a head suspension assembly, according to an embodiment of the present invention.

FIG. 8 depicts a method 800 to fabricate a head suspension assembly, according to an embodiment of the present invention. In step 802, a laminated flexure having a laminated flexure tail is provided. In certain embodiments, the laminated flexure tail would include a stainless steel layer, a plurality of copper traces, and a dielectric layer disposed between the stainless steel layer and the plurality of copper traces. In step 804, a first polymer layer (e.g. polyimide) is deposited on the plurality of copper traces, so that the plurality of copper traces is disposed between the dielectric layer and the first polymer layer. Preferably, the first polymer layer contiguously covers a continuous length of the plurality of copper traces.

Still referring to FIG. 8, in step 806 a second polymer layer (e.g. polyimide) is deposited on the first polymer layer, and over at least one of the plurality of copper traces. The deposition of the second polymer layer is preferably patterned to form a plurality of stand-off islands separated by at least one gap over the continuous length. In step 808, the laminated flexure is attached to a load beam of the head suspension assembly, for example by adhesive tacking (e.g. epoxy) or spot welding.

In certain embodiments, the first polymer layer may comprise polyimide that is preferably deposited until a first polymer layer thickness of 4 microns to 18 microns is reached. In certain embodiments, the second polymer layer may comprise polyimide that is preferably deposited until a second polymer layer thickness of 12 microns to 18 microns is reached. In certain embodiments, the gap between the stand-off islands may define a longitudinal spacing that may preferably be in the range of 4 mm to 9 mm.

The invention is described herein with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:

1. A head stack assembly (HSA) comprising:
   an actuator including an actuator body and an actuator arm extending from the actuator body, a side of the actuator arm including a slot, the slot having an inner slot surface;
   a flex cable attached to the actuator; and
   a head gimbal assembly (HGA) attached to the actuator arm, the HGA including
      a load beam;
      a laminated flexure attached to the load beam, the laminated flexure including a laminated flexure tail attached to the flex cable and being disposed partially within the slot; and
      a head attached to the laminated flexure;
   wherein the laminated flexure tail comprises
      a structural layer;
      a plurality of conductive traces disposed on a dielectric layer, the dielectric layer being disposed between the structural layer and the plurality of conductive traces;
      a first insulative cover layer disposed on the plurality of conductive traces, so that the plurality of conductive traces is disposed between the dielectric layer and the first insulative cover layer; and
      a plurality of stand-off islands disposed on the first insulative cover layer and over at least one of the plurality of conductive traces, so that the first insulative cover layer is disposed between the at least one of the plurality of conductive traces and the plurality of stand-off islands;
      wherein at least one of the plurality of stand-off islands is disposed between the first insulative cover layer and the inner slot surface.

2. The HSA of claim 1 wherein the laminated flexure tail has a long axis that is oriented approximately parallel to the side of the actuator arm.

3. The HSA of claim 2 wherein the slot extends longitudinally between a proximal longitudinal extent and a distal longitudinal extent, and the at least one of the plurality of stand-off islands overlaps the proximal longitudinal extent, and at least one other of the plurality of stand-off islands overlaps the distal longitudinal extent.

4. The HSA of claim 2 wherein the laminated flexure tail defines a tail width measured transverse to the long axis, and each of the plurality of the stand-off islands is longitudinally separated from another by at least 4 mm but no more than 4 times the tail width.

5. The HSA of claim 2 wherein each of the plurality of the stand-off islands is longitudinally separated from another by a longitudinal spacing in the range of 4 mm to 9 mm.

6. The HSA of claim 5 wherein the first insulative cover layer contiguously covers a continuous length of the plurality of conductive traces, and the longitudinal spacing is disposed within said continuous length.

7. The HSA of claim 1 wherein the first insulative cover layer comprises polyimide having a thickness of 4 microns to 18 microns.

8. The HSA of claim 1 wherein each of the plurality of stand-off islands is a patterned region of a second insulative cover layer disposed on the first insulative cover layer.

9. The HSA of claim 8 wherein the second insulative cover layer comprises polyimide having a second cover layer thickness in the range 12 microns to 18 microns.

10. The HSA of claim 1 wherein each of the plurality of stand-off islands comprises epoxy having a thickness over the at least one of the plurality of conductive traces that is greater than 18 microns.

11. The HSA of claim 1 wherein the dielectric layer comprises polyimide, the structural layer comprises stainless steel, and the plurality of conductive traces comprises copper.

12. The HSA of claim 1 wherein the at least one of the plurality of conductive traces is a trace that is electrically connected to a write transducer of the head.

13. A head gimbal assembly (HGA) comprising:
    a load beam;
    a laminated flexure attached to the load beam and including a laminated flexure tail extending away from the load beam; and
    a head attached to the laminated flexure;
    wherein the laminated flexure tail comprises
       a structural layer;
       a plurality of conductive traces disposed on a dielectric layer, the dielectric layer being disposed between the structural layer and the plurality of conductive traces;
       a first insulative cover layer disposed on the plurality of conductive traces, so that the plurality of conductive traces is disposed between the dielectric layer and the first insulative cover layer; and
       a plurality of stand-off islands disposed on the first insulative cover layer and over at least one of the plurality of conductive traces of the laminated flexure tail, so that the first insulative cover layer is disposed between the at least one of the plurality of conductive traces and the plurality of stand-off islands;
       wherein each of the plurality of the stand-off islands is longitudinally separated from another by a longitudinal spacing in the range of 1 mm to 15 mm.

14. The HGA of claim 13 wherein the first insulative cover layer comprises polyimide having a thickness of 4 microns to 18 microns.

15. The HGA of claim 13 wherein each of the plurality of stand-off islands is a patterned region of a second insulative cover layer.

16. The HGA of claim 15 wherein the second insulative cover layer comprises polyimide having a second cover layer thickness in the range 12 microns to 18 microns.

17. The HGA of claim 13 wherein each of the plurality of stand-off islands comprises epoxy having a thickness over the at least one of the plurality of conductive traces that is greater than 18 microns.

18. The HGA of claim 13 wherein the dielectric layer comprises polyimide, the structural layer comprises stainless steel, and the plurality of conductive traces comprises copper.

19. The HGA of claim 13 wherein the at least one of the plurality of conductive traces is a trace that is electrically connected to a write transducer of the head.

20. The HGA of claim 13 wherein the first insulative cover layer contiguously covers a continuous length of the plurality of conductive traces, and the longitudinal spacing is disposed within said continuous length.

21. A method of fabricating a head suspension assembly, the method comprising:
 providing a laminated flexure having a laminated flexure tail that includes a stainless steel layer, a plurality of copper traces, and a dielectric layer disposed between the stainless steel layer and the plurality of copper traces;
 depositing a first polymer layer on the plurality of copper traces, so that the plurality of copper traces is disposed between the dielectric layer and the first polymer layer, the first polymer layer contiguously covering a continuous length of the plurality of copper traces;
 depositing a second polymer layer on the first polymer layer and over at least one of the plurality of copper traces, the deposition of the second polymer layer being patterned to form a plurality of stand-off islands separated by at least one gap over the continuous length; and
 attaching the laminated flexure to a load beam of the head suspension assembly.

22. The method of claim 21 wherein the first polymer layer comprises polyimide deposited until a first polymer layer thickness of 4 microns to 18 microns is reached.

23. The method of claim 22 wherein the second polymer layer comprises polyimide deposited until a second polymer layer thickness of 12 microns to 18 microns is reached.

24. The method of claim 21 wherein the at least one gap defines a longitudinal spacing between stand-off islands in the range of 4 mm to 9 mm.

* * * * *